US006867604B2

(12) United States Patent
Haldeman et al.

(10) Patent No.: US 6,867,604 B2
(45) Date of Patent: Mar. 15, 2005

(54) APPARATUS FOR ACCURATELY MEASURING BATTERY VOLTAGE

(75) Inventors: David P. Haldeman, Broomfield, CO (US); Edde Tin Shek Tang, Louisville, CO (US)

(73) Assignee: International Business Machines Corporation, Armonk, NY (US)

( * ) Notice: Subject to any disclaimer, the term of this patent is extended or adjusted under 35 U.S.C. 154(b) by 111 days.

(21) Appl. No.: 10/186,815

(22) Filed: Jun. 28, 2002

(65) Prior Publication Data

US 2004/0000914 A1 Jan. 1, 2004

(51) Int. Cl.[7] .............................. G01R 27/08; H02J 7/00
(52) U.S. Cl. ........................................ 324/705; 320/137
(58) Field of Search ................................ 324/705, 691, 324/649, 600, 425, 426, 427, 428–435; 320/124, 125, 127, 134, 136–139, 140, 112, 113, 115, 116, 128

(56) References Cited

U.S. PATENT DOCUMENTS

| | | | |
|---|---|---|---|
| 4,393,347 A | | 7/1983 | Looper |
| 5,371,469 A | | 12/1994 | Anderson |
| 5,448,173 A | | 9/1995 | Shinohara et al. |
| 5,744,984 A | * | 4/1998 | Drapac et al. ................. 327/89 |
| 5,838,141 A | | 11/1998 | Sengupta et al. |
| 5,903,131 A | * | 5/1999 | Sekine et al. ................ 320/106 |
| 5,914,611 A | | 6/1999 | Cheng |
| 6,215,291 B1 | * | 4/2001 | Mercer ......................... 323/313 |
| 6,326,767 B1 | * | 12/2001 | Small et al. .................. 320/116 |
| 6,479,968 B1 | * | 11/2002 | Pozsgay et al. .............. 320/137 |

* cited by examiner

Primary Examiner—Anjan Deb
Assistant Examiner—Hoai-An D. Nguyen
(74) Attorney, Agent, or Firm—Arthur J. Samodovitz

(57) ABSTRACT

A circuit for measuring voltage of a battery or group of batteries whose terminals are not directly accessible. The battery or group of batteries can have three leads. First and second leads are connected to the voltage output of the battery and the third lead is connected to the return of the battery. The three leads may terminate in a three prong plug which may plug into a printed circuit board to form a module. The module can be connected into a rack via an edge connector. A battery voltage measurement circuit can be located on another printed circuit board which is also plugged into the rack. This other printed circuit board may be interconnected to the battery module by wire traces within the rack. Thus, there are one or more first connectors between the first lead of the battery or group of batteries and the charger. There are one or more second connectors between the second lead of the battery or group of batteries and an input of the voltage measurement circuit. There are also one or more third connectors between the third lead of the battery or group of batteries and ground. A first portion of the voltage measurement circuit measures a voltage across the one or more first connectors and the one or more second connectors. A second portion of the voltage measurement circuit determines a difference between the voltage across the one or more first connectors and the one or more second connectors and a voltage measured across the one or more second connectors, the battery and the one or more third connectors to indicate an approximate voltage of the battery or group of batteries. There is negligible voltage drop across the one or more second connectors. Thus, the circuit accurately measures the battery voltage during charging, because it cancels significant voltage drops across the intervening connectors.

20 Claims, 5 Drawing Sheets

APPARATUS FOR ACCURATELY MEASURING BATTERY VOLTAGE

BACKGROUND OF THE INVENTION

The present invention relates generally to apparatus for accurately measuring a voltage of a rechargeable battery in systems where there is no direct access to battery terminals.

Many types of electronic devices such as computers and data storage devices rely on batteries for backup during power interruptions. Other, portable electronic devices such as laptop computers rely on batteries for main power when the portable device is not plugged into an AC power source. Typically, the battery is rechargeable. It is important to accurately charge the battery to its optimum voltage level and this requires an accurate, real time measurement of the battery voltage during charging.

In the prior art there have been difficulties in accurately measuring the battery voltage during charging, in systems where the battery terminals cannot be accessed directly. For example, the battery or battery pack may be plugged into a printed circuit board to form a battery module, so there is a series resistance in lead wires between the battery terminals and the plug and at the plug itself. Also, the printed circuit board may be inserted into a rack using an edge connector, so there is a series resistance in wire traces on the printed circuit board between the plug and the edge connector and at the edge connector itself. The voltage sensor may be located on another printed circuit board. This other printed circuit board may be connected to the rack using an edge connector, so there is a series resistance in the wire traces between the voltage sensor and the edge connector and at the edge connector itself. Likewise, the charger may be located on a third printed circuit board with an edge connector, or on the same printed circuit board as the voltage sensor, so there is a series resistance in the wire traces between the charger and the edge connector and at the edge connector itself. There are also wire traces on the rack between the different edge connectors of the different printed circuit boards, so there is a series resistance caused by these wire traces. Some of the series resistances in the system cause significant voltage drops during charging, if substantially current passes through them. Heretofore, these voltage drops have prevented an accurate, remote measurement of the battery voltage by the voltage sensor, during charging.

An apparatus, generally designated 8 according to the Prior Art, for measuring battery voltage during charging is schematically illustrated in FIGS. 1–4. A battery pack 10 has three lead wires, one for fast charging from fast charge circuitry 12. By way of example, the fast charge circuit 12 supplies 0.8 DC amps of charging current, although the amount depends on the type of battery to be charged and other factors. Another lead wire of the battery pack is for trickle charge from a pulsed trickle charge circuit 14, a voltage sense input to a charge control circuit 16, a voltage sense input to a "gas gauge" circuit 18 and to supply a load 20. By way of example, the trickle charge circuit 14 supplies 0.2 amps of pulsed current, although the magnitude of the current and the duty cycle also depend on the type of battery and other known factors. The "gas gauge" measures the battery voltage in conjunction with the current that flows into the battery and flows out of the battery, for purposes of estimating the remaining amount of time the device can be run on the battery. In the illustrated example, the battery 10 drives a DC to DC converter which supplies a load, for example, a data storage device, although the type of load is variable. The third wire lead of the battery pack is the current return for the battery pack via a discreet series resistor 22. The series resistor 22 is small, for example, 0.2 ohms, and can be used to monitor the battery current.

The battery pack 10, with its three leads, is plugged into a printed circuit board 31 and encased to form a battery module 36 (FIG. 2). By way of example, the battery pack plug is a three-pronged type, and the printed circuit board 31 has an edge connector $30a,b,c$ for connection to a rack. The wire leads between the battery terminals and the plug, wire traces on the printed circuit board between the plug and the edge connector, and the edge connector itself cause a series resistance associated with the battery module. The edge connector of the printed circuit board 31 is connected to a mating connector $30a', b', c'$ of a rack 33 (FIG. 4). A printed circuit board 32 (FIG. 3) contains fast charge circuit 12, pulse trickle charge circuit 14, charge control circuit 16, gas gauge 18, DC to DC converter circuit 20, a battery current sense resistor 22 and a ground path. Printed circuit board 32 has a connector $40a',b',c'$ and is connected into rack 33 via a mating connector $40a,b,c$. (Alternately, the fast charge circuit 12, trickle charge circuit 14, charge control circuit 16, gas gauge 18 and load 20 could be contained on different printed circuit boards which insert into respective connectors of the rack 33 via respective edge connectors or other types of connectors. Different connectors are also shown in FIG. 4 for this purpose.) Wire traces on the rack between the different connectors cause a series resistance $34a,b,c$ schematically shown in FIGS. 1 and 4.

During fast charging, considerable current is supplied to the battery 10 from fast charge circuit 12. This considerable current passes through connector $40a,a'$, resistor $34a$ and connector $30a,a'$ through the battery, through connector $30c,c'$, resistor $34c$ and connector $40c,c'$ and through battery current sense resistor 22 to ground. Charge control circuit 16 measures the voltage from connector $40b'$ to ground. During fast charging, the DC-DC converter is disabled (at ENable input) and/or a diode 23 at the output of the DC-DC converter is reversed biased by a DC voltage, Vcc, supplied by the AC source via an AC-DC converter (not shown). Therefore, during fast charging, the DC-DC converter does not draw any current. Also, the impedance at the input of charge control circuit 16 is always very high. So, during fast charging, very little current flows through connector $30b,b'$ resistor $34b$ and connector $40b,b'$. Consequently, there is negligible voltage drop across connector $30b,b'$ resistor $34b$ and connector $40b,b'$ during fast charging. However, the voltage drop across connector $30c,c'$ resistor $34c$ and connector $40c,c'$ and current sense resistor 22 increases the voltage input to the charge control circuit 14, and this distorts the measurement of the battery voltage.

During battery discharge, there is considerable current flowing from ground, through resistor 22 and into the battery, and from the battery through connector $30b,b'$ resistor $34b$ and connector $40b,b'$ into the DC-DC converter. This causes a significant voltage drop across connector $30b,b'$ resistor $34b$ and connector $40b,b'$ and decreases the voltage input to the gas gauge 18. (The gas gauge does not consider the voltage drop across resistor 22 because of the location of the reference for the gas gauge, and also because the voltage drop across resistor 22 is internally compensated by the gas gauge.) This also distorts the measurement of the battery voltage.

Accordingly, an object of the present invention is to provide an apparatus for accurately measuring a voltage of a battery during charging, in a system where the battery terminals are not directly accessible.

Another object of the present invention is to provide an apparatus of the foregoing type where the battery is plugged into a module, and the module is inserted into a rack.

Another object of the present invention is to provide an apparatus of the foregoing type which is adapted to a three lead battery module.

SUMMARY OF THE INVENTION

The invention resides in a circuit for measuring voltage of a battery or group of batteries whose terminals are not directly accessible. The battery or group of batteries can have three leads. First and second leads are connected to the voltage output of the battery and the third lead is connected to the return of the battery. The three leads may terminate in a three prong plug which may plug into a printed circuit board to form a module. The module can be connected into a rack via an edge connector. A battery voltage measurement circuit can be located on another printed circuit board which is also plugged into the rack. A battery charger and a battery charger controller (which is dependent on the battery voltage measurement circuit), are typically included, and may be located on this other printed circuit board. This other printed circuit board may be interconnected to the battery module by wire traces within the rack. Thus, there are one or more first connectors between the first lead of the battery or group of batteries and the charger. There are one or more second connectors between the second lead of the battery or group of batteries and an input of the voltage measurement circuit. There are also one or more third connectors between the third lead of the battery or group of batteries and ground. A first portion of the voltage measurement circuit measures a voltage across the one or more first connectors and the one or more second connectors. A second portion of the voltage measurement circuit determines a difference between the voltage across the one or more first connectors and the one or more second connectors and a voltage measured across the one or more second connectors, the battery and the one or more third connectors to indicate an approximate voltage of the battery or group of batteries. There is negligible voltage drop across the one or more second connectors. Thus, the circuit accurately measures the battery voltage during charging, because it cancels significant voltage drops across the intervening connectors.

DETAILED DESCRIPTION OF THE PREFERRED EMBODIMENTS

Figure 1:
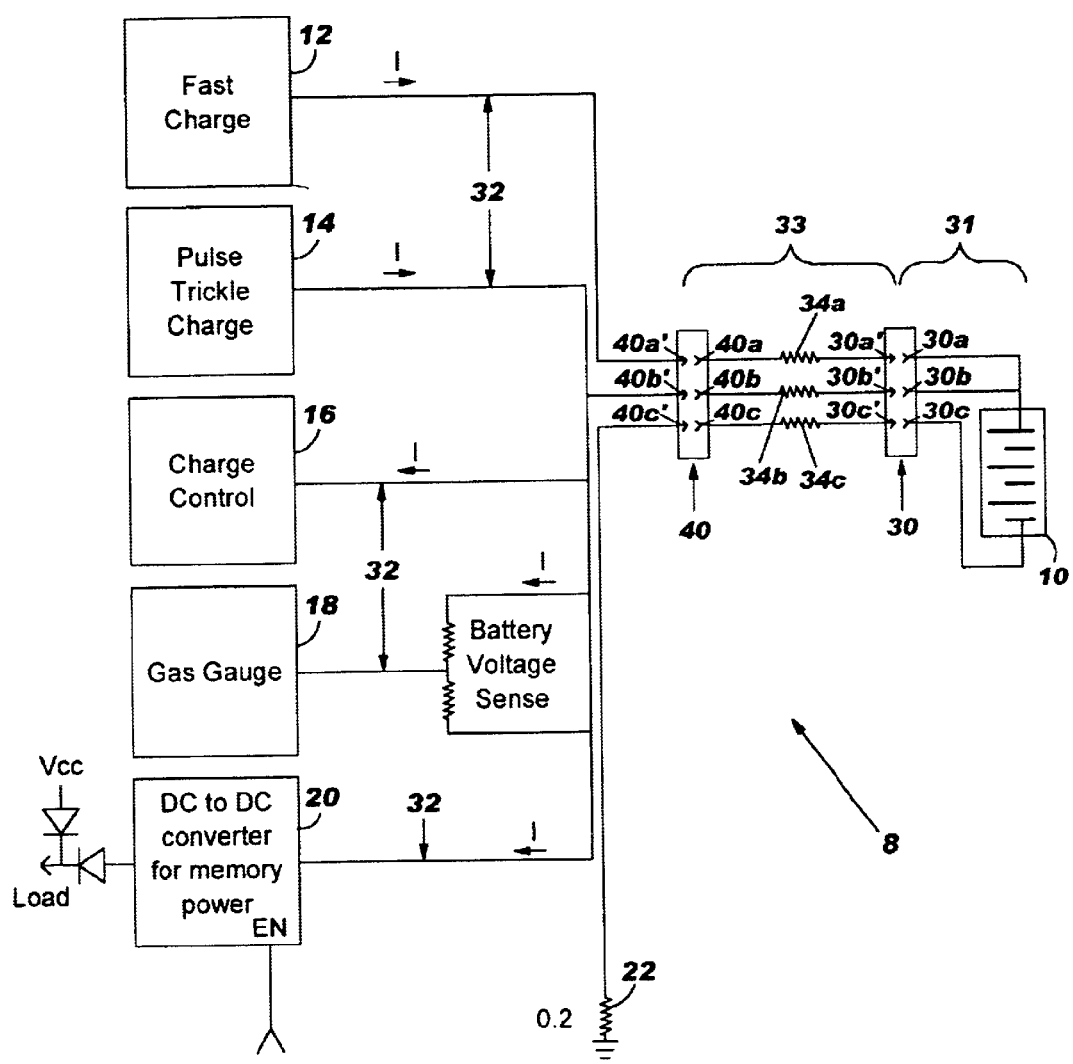
FIG. 1 is a circuit diagram of a battery voltage measuring circuit according to the Prior Art.
Figure 3:
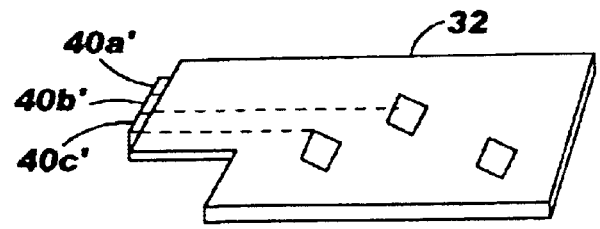
FIG. 3 is a perspective view of a printed circuit board containing a fast charge circuit, trickle charge circuit, charge control circuit, gas gauge, DC to DC converter circuit, and battery current sense resistor according to the Prior Art.
Figure 2:
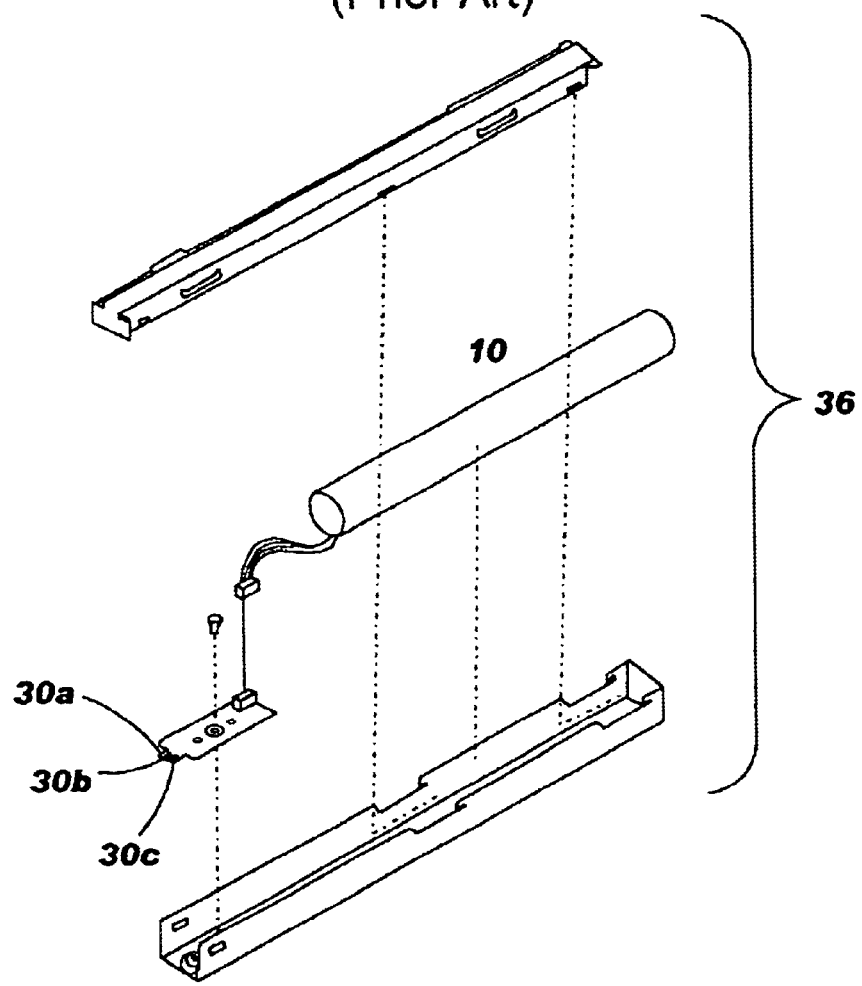
FIG. 2 is an exploded view of a battery module according to the Prior Art.
Figure 4:
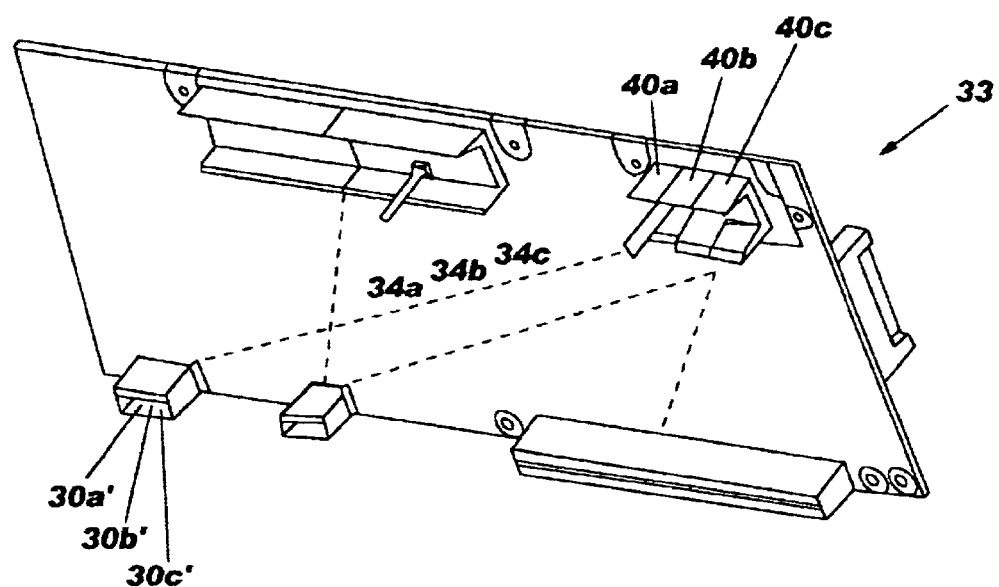
FIG. 4 is a perspective view of a rack according to the Prior Art, into which the battery module of FIG. 2 and the printed circuit board of FIG. 3 are inserted during operation.
Figure 5:
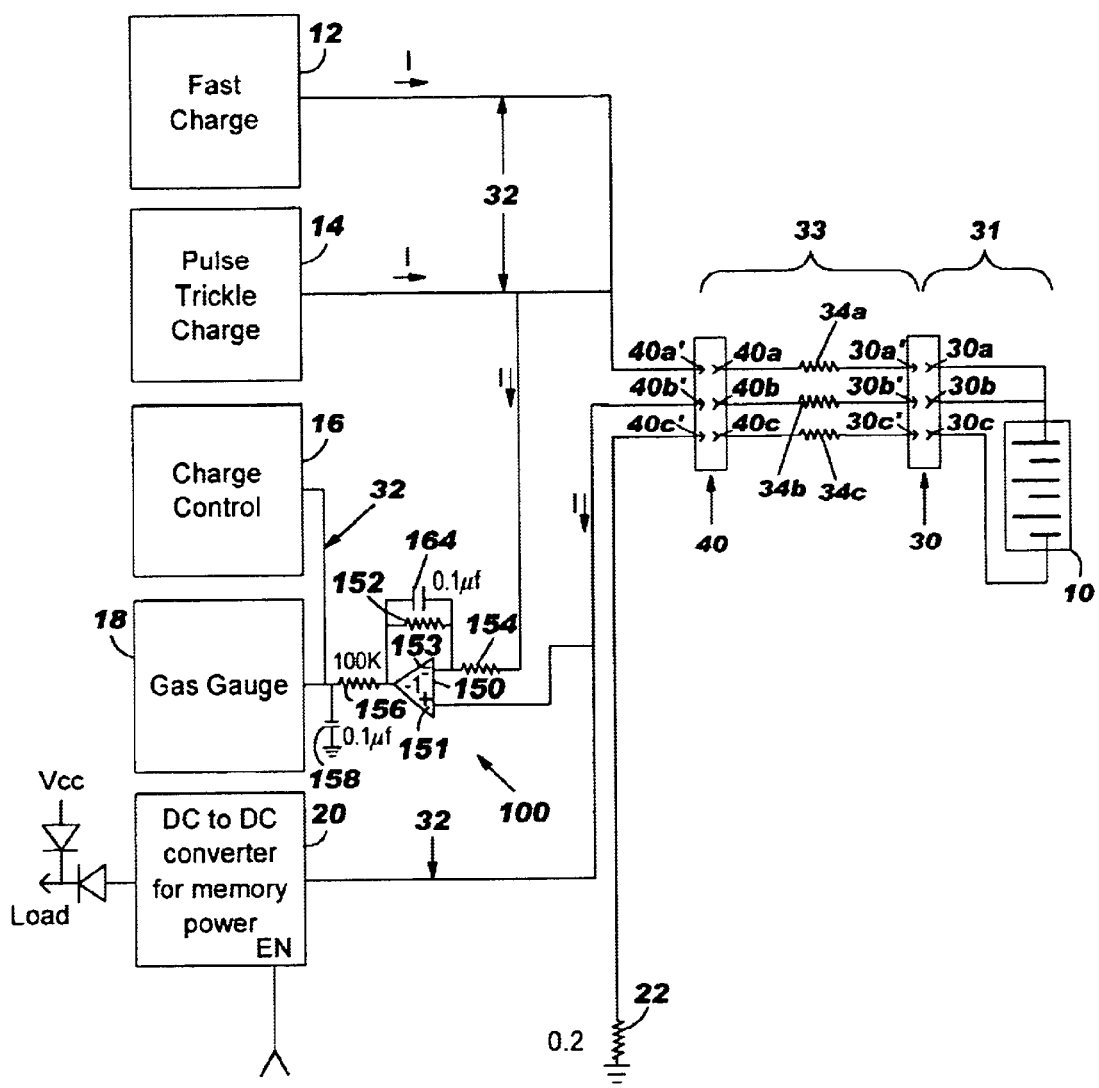
FIG. 5 is a circuit diagram of a battery voltage measuring circuit according to one embodiment of the present invention.

FIG. 5 illustrates a battery voltage monitoring circuit general designated 100 according to the present invention. Circuit 100 is the same as circuit 8 except as follows. Another series, discreet resistor 122 is added between the fast charge circuit 12 and connector 40a'. Resistor 122 has the same resistance as resistor 22, to balance the voltage drop across both as explained below. Also, an amplifier 150 and associated input resistor 154 and associated feedback resistor 152 have been added to measure the voltage across the battery pack 10 exclusive of the voltage drops across resistors 22 or 122 and connectors 30, resistors 34 and connectors 40. This measurement can be made during charging by circuit 12.

Amplifier 150 exhibits features of both a unity gain, non-inverting amplifier for its non-inverting input 151 and a differential, inverting amplifier for its inverting input 153. Amplifier 150 sums together both results at its output. More specifically, amplifier 150 operates as follows. The differential, inverting amplifier feature measures the difference between the voltage at the output of the fast charge circuit and the voltage at connector 40b'. The gain is "negative one" because feedback resistor 152 has the same value as input resistor 154. This differential approximately equals the voltage drop across resistor 122 and connector 40a,a', resistor 34a and connector 30a,a'. There is negligible voltage drop across connector 30b,b', resistor 34b and connector 40b,b' during charging mode because amplifier 150 always has high input impedance and no current flows to the DC-DC converter during charging; it is disabled and/or output diode 23 is reversed biased. Virtually all the current flowing through resistor 122 and connector 40a,a', resistor 34a and connector 30a,a' lows through battery 10. This differential voltage inverted is provided as an addend at the output of amplifier 150. The feedback path also includes a capacitor 164 to provide low pass filtering. Likewise, an output, series resistor 156 and a parallel capacitor 158 provide additional low pass filtering.

The non-inverting amplifier feature of amplifier 150 measures the voltage at connector 40b' and provides this as an addend non-inverted at the output of amplifier 150. Thus, the voltage generated by the differential, inverting amplifier feature is summed with the voltage generated by the non-inverting amplifier feature. The voltage at connector 40b' approximately equals the voltage across battery 10 plus the voltage across connector 30c,c', resistor 34c and connector 40c,c' and resistor 22. The same current flows through resistor 122 and connector 40a,a', resistor 34a,a' and connector 30a,a' as through resistor 22 and connector 40c,c', resistor 34c,c' and connector 30c,c'. Also, resistor 122 equals resistor 22 and the resistances across connector 40a,a', 34a,a' and connector 30a,a' are approximately the same as the resistances across connector 40c,c', resistor 34c,c' and connector 30c,c'. This is because the connectors are the same. The only difference in the resistances is due to differences in length of the wire traces. Ideally, these differences are kept at a minimum and less than the resistances of the connectors. Consequently, the voltage across resistor 122 and connector 40a,a', resistor 34a,a' and connector 30a,a' is approximately the same as the voltage across resistor 22 and connector 40c,c', resistor 34c and connector 30c,c'. Thus, the output of amplifier 150 approximately equals the voltage across the battery 10 independent of the voltage drops across resistors 22 or 122 or the connectors 40, resistors 34 and connectors 30.

Over time, the resistance of each of the connections will likely increase due to degradation of the edge connectors and plugs resulting from mechanical vibrations, temperature and humidity effects and ware-out from insertion and extraction of the connectors. For example, typically there is gold plating on the edge connectors and possibly the plug which wares-out from repeated insertion and extraction. Also, the resiliency of the mating connector 40$a',b',c'$ may degrade so there is less pressure of engagement upon the edge connector 40$a,b,c$. However, the resistance increase will likely be uniform within all three points of connection of connector 40, and uniform within all three points of connection of plug 30. Thus, amplifier 150 will still cancel the voltage drop across connector 40$a,a'$, resistor 34$a$ and connector 30$a,a'$ with the voltage drop across connector 40$c,c'$, resistor 34$c$ and connector 30$c,c'$ over time even though the connection resistances will increase.

The sum of the differential, inverting amplifier feature and the non-inverting amplifier feature of amplifier 150 also includes twice the voltage across connector 40$b,b'$, resistor 34$b$ and connector 30$b,b'$. The voltage across this path is not canceled by the amplifier 150. However, as explained above in reference to apparatus 8, there is a negligible voltage drop across connector 40$b,b'$, resistor 34$b$ and connector 30$b,b'$ in apparatus 100 during fast charging because the DC-DC converter does not draw any current; it is disabled and/or the output diode 23 is reversed biased.

Figure 6:
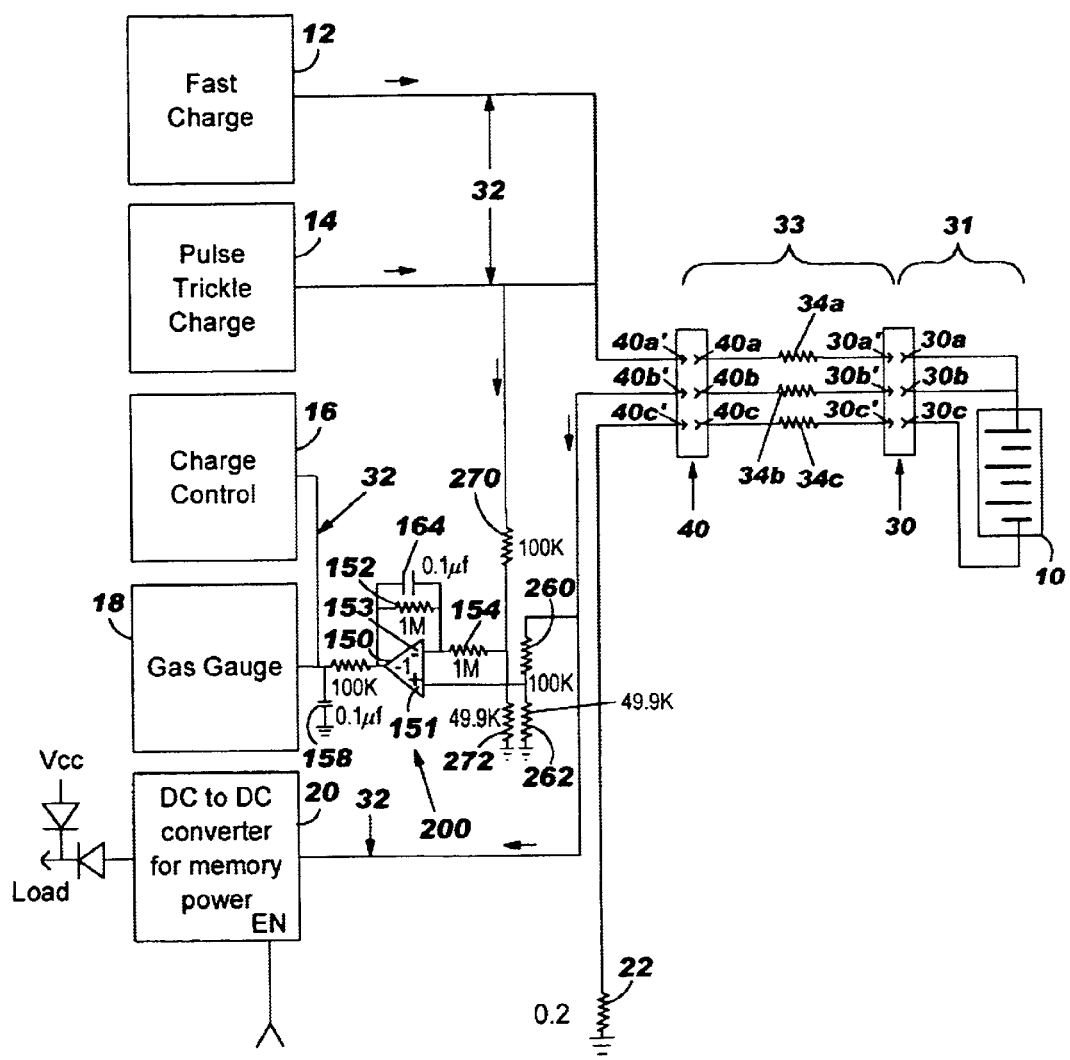
FIG. 6 is a circuit diagram of a battery voltage measuring circuit according to another embodiment of the present invention.

FIG. 6 illustrates another embodiment of the present invention generally designated as circuit 200. Circuit 200 is the same as circuit 100 except for the following. There is an approximately 1:3 voltage divider at both inputs to amplifier 150 (resistor 260 and resistor 262 at the inverting input and resistor 270 and 272 at the non-inverting input), although other voltage divisions could be used also. With these identical voltage dividers at both inputs, the differential, inverted voltage is one third the amount described in circuit 100, and the non-inverted voltage is one third the amount described in circuit 100. So, the output of amplifier 150 in circuit 200 is still approximately independent of the voltage drop across resistors 22 and 122 and connector 40, resistor 34 and connector 30, but is only one third the voltage across the battery pack 10. In this embodiment, battery pack 10 comprises three batteries in series. Thus, the voltage division of 1:3 was chosen so the output of amplifier 150 equals the average of the voltage across the three batteries within battery pack 10.

Based on the foregoing, battery voltage measuring circuits according to two embodiments of the present invention have been disclosed. However, numerous modifications and substitutions can be made without deviating from the scope of the present invention. For example, the present invention can be implemented with circuits other than amplifier 150, provided the voltage drop across resistor 22, connector 40$c,c'$, resistor 34$c$ and connector 30$c,c'$ is offset by the voltage drop across resistor 122, connector 40$a,a'$, resistor 34$a,a'$ and connector 30$a,a'$. By way of example, there could be two separate amplifiers, one to measure and invert the differential voltage across resistor 122, connector 40$a,a'$, resistor 34$a$ and connector 30$a,a'$ and another to measure the voltage at connector 40$b'$, and an adder to sum the output of both amplifiers. Also, there may be different types of resistances between the battery and the rack 38 and ground and between the fast charge circuit and the rack. The present invention will accommodate such arrangements provided the total resistance between the voltage terminal of the battery and the fast charge circuit is approximately the same as the total resistance between the ground terminal of the battery and ground. Also, in some applications there will be no resistor 22 to measure the battery current. In such a case, there will be no resistor 122. Therefore, the present invention has been disclosed by way of illustration and not limitation and reference should be made to the following claims to determine the scope of the present invention.

What is claimed is:

1. A battery voltage measurement circuit for measuring voltage of a battery or group of batteries mounted in an apparatus, said apparatus having one or more first connectors between a first lead of said battery or group of batteries and a first portion of said circuit and a battery charger, one or more second connectors between a second lead of said battery or group of batteries and second portion of said circuit and a primary load, and one or more third connectors between a third lead of said battery or group of batteries and ground, said first and second leads being connected to one terminal of said battery and said third lead being connected to another terminal of said battery, said circuit comprising:

said first portion to measure a voltage across said one or more first connectors and said one or more second connectors; and said second portion to determine a difference between the voltage measured by said first portion and a voltage across said one or more second connectors, said battery or group of batteries and said one or more third connectors to indicate an approximate voltage or said battery or group of batteries.

2. A battery voltage measurement circuit as set fourth in claim 1 further comprising:

a first discreet resistor connected in series with said one or more first connectors between said first lead and said first portion and said battery charger, and a second discreet resistor connected in series with one or more third connectors between said third lead and ground, and wherein said first discreet resistor is approximately the same as said second discreet resistor, said first portion measure a voltage across said first discreet resistor, said one or more first connectors and said one or more second connectors, ands said second portion determines a difference between the voltage measured by said first portion and a voltage across said one or more second connectors, said battery or group of batteries, said one or more third connectors and second discreet resistor.

3. A battery voltage measurement circuit as set fourth in claim 1 wherein a resistance of said one or more first connectors is approximately the same as a resistance of said one or more third connectors.

4. A battery voltage measurement circuit as set fourth in claim 1 wherein there is a negligible voltage drop across said one or more second connectors compared to the voltage drop across said one or more first connectors and said one or more third connectors, during charging the battery.

5. A battery voltage measurement circuit as set forth in claim 1 wherein said battery or group of batteries removably plug into a module, said module removably plugs into a rack, said charger removably plugs into rack, and said one or more first connectors cause a resistance where the battery or group of batteries plug into said module and a resistance where said module plugs into said rack.

6. A battery voltage measurement circuit as set forth in claim 5 wherein said one or more second connectors cause a resistance where the battery or group of batteries plug into said module and a resistance where said module plugs into said rack.

7. A battery voltage measurement circuit as set forth in claim 6 wherein said one or more third connectors cause a resistance where the battery or group of batteries plug into said module and a resistance where said module plugs into said rack.

8. A system for measuring voltage of a battery or group of batteries, said battery or group of batteries being mounted in an apparatus which has one or more first connectors between a first lead of said battery or group of batteries and a charger, one or more second connectors between a second lead of said battery or group of batteries and an input of a controller of said charger and a primary load, and one or more third connectors between a third lead of said battery or group of batteries and ground, said system comprising:

a first circuit to measure a voltage across said one or more first connectors; and said one or more second connectors; and a second circuit to determine a difference between said voltage across said one or more first connectors and said one or more second connectors and a voltage measured at said input of said controller to indicate an approximate voltage of said battery or group of batteries.

9. A system as set forth in claim 8 wherein a resistance of said one or more first connectors is approximately the same as a resistance of said one or more third connectors.

10. A system as set fourth in claim 9 wherein there is a negligible voltage drop across said one or more second connectors compared to the voltage drop across said one or more first connectors and said one or more third connectors, during charging of said battery.

11. A system as set forth in claim 8 further comprising a first discreet resistor connected in series with said one or more first connectors between said first lead and said charger, and a second discreet resistor connected in series with said one or more third connectors between said third lead and ground, and wherein said first discreet resistor is approximately the same as said second discreet resistor, and said first circuit measures a voltage across said first discreet resistor, said one or more first connectors and said one or more second connectors.

12. A system set forth in claim 11 wherein there is a negligible voltage drop across said one or more second connectors during charging of said battery.

13. A system set forth in claim 8 wherein said battery or group of batteries removably plug into a module, said module removably plugs into a rack, said charger removably plugs into said rack, and said one or more first connectors cause a resistance where there battery or group of batteries plug into a said module and a resistance where said module plugs into said rack.

14. A system as set forth in claim 13 wherein said one or more second connectors cause a resistance where the battery or group of batteries plug into said module and a resistance where said module plugs into rack.

15. A system as set forth in claim 14 wherein said one or more third connectors cause a resistance where the battery or group of batteries plug into said module and a resistance where said module plugs into said rack.

16. A system as set forth in claim 15 wherein said charger is on a printed circuit board which plugs into said rack, and there is a series resistance caused where said charger printed circuit board plugs into said rack.

17. A system as set forth in claim 16 wherein said first and second circuits are on one or more printed circuit boards which plug into said rack, and there is a series resistance caused where said first and second circuit printed circuit board(s) plug into said rack.

18. A system as set forth in claim 17 wherein said ground is provided to said third lead from a printed circuit board which plugs into said rack, and there is a series resistance caused where said ground printed circuit board plugs into said rack.

19. A system as set forth in claim 17 where said difference determination made by said second circuit results in a measurement of the voltage across said battery plus or minus twice the voltage across said one or more second connectors, and the voltage across said one or more second connectors is much smaller than a voltage across said one or more first connectors.

20. A system as set forth in claim 8 wherein said first circuit comprises a differential amplifier portion of an amplifier, and said second circuit comprises a non-inverting amplifier portion of said amplifier.

* * * * *